(12) United States Patent
Qiu et al.

(10) Patent No.: US 11,778,863 B2
(45) Date of Patent: Oct. 3, 2023

(54) DISPLAY SUBSTRATE, METHOD FOR MANUFACTURING DISPLAY SUBSTRATE, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yuanyou Qiu, Beijing (CN); Yao Huang, Beijing (CN); Cong Liu, Beijing (CN); Binyan Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/626,770

(22) PCT Filed: Apr. 13, 2021

(86) PCT No.: PCT/CN2021/086859
§ 371 (c)(1),
(2) Date: Jan. 12, 2022

(87) PCT Pub. No.: WO2021/218625
PCT Pub. Date: Nov. 4, 2021

(65) Prior Publication Data
US 2022/0293708 A1  Sep. 15, 2022

(30) Foreign Application Priority Data

Apr. 29, 2020  (CN) .......................... 202010354537.3

(51) Int. Cl.
*H01L 27/32* (2006.01)
*H10K 59/121* (2023.01)
*H10K 59/12* (2023.01)

(52) U.S. Cl.
CPC ..... *H10K 59/1216* (2023.02); *H10K 59/1201* (2023.02)

(58) Field of Classification Search
None
See application file for complete search history.

(56) References Cited

U.S. PATENT DOCUMENTS

2016/0141349 A1* 5/2016 Yun ..................... H01L 27/3258
438/23
2018/0033847 A1* 2/2018 Kim ................... H01L 27/1288
(Continued)

FOREIGN PATENT DOCUMENTS

CN      101140747 A  *  3/2008
CN      107293570 A      10/2017
(Continued)

OTHER PUBLICATIONS

CN 202010354537.3 first office action.
PCT/CN2021/086859 international search report and written opinion.

*Primary Examiner* — Nilufa Rahim
(74) *Attorney, Agent, or Firm* — IPRO, PLLC

(57) ABSTRACT

A display substrate, a manufacturing method thereof, and a display device are provided. The display substrate includes a base substrate, a driving circuit layer and a light-emitting unit located on the base substrate, the light-emitting unit includes a first and a second electrodes being laminated, a light-emitting layer located therebetween; the display substrate includes a first and a second display regions, an opening region; the second display region is located between the first and the opening display regions; a pixel density of
(Continued)

the first display region is greater than that of the second display region; and the display substrate further includes a compensation capacitor for compensating a sub-pixel in the second display region, the compensation capacitor includes a first and second plates, the first plate is electrically connected to the gate electrode of the sub-pixel in the second display region, the second plate is electrically connected to the first electrode.

13 Claims, 4 Drawing Sheets

(56) References Cited

U.S. PATENT DOCUMENTS

| 2018/0040680 | A1 | 2/2018 | Cai |
| 2021/0294382 | A1 | 9/2021 | Ma et al. |
| 2022/0190056 | A1 | 6/2022 | Guo et al. |

FOREIGN PATENT DOCUMENTS

| CN | 108766237 | A | | 11/2018 |
| CN | 109801947 | A | * | 5/2019 |
| CN | 109801947 | A | | 5/2019 |
| CN | 110364109 | A | | 10/2019 |
| CN | 209560243 | U | | 10/2019 |
| CN | 110400535 | A | | 11/2019 |
| CN | 209843713 | U | | 12/2019 |
| CN | 111509019 | A | | 8/2020 |

* cited by examiner

DISPLAY SUBSTRATE, METHOD FOR MANUFACTURING DISPLAY SUBSTRATE, AND DISPLAY DEVICE

CROSS-REFERENCE TO RELATED APPLICATIONS

This application is the U.S. national phase of PCT Application No. PCT/CN2021/086859 filed on Apr. 13, 2021, which claims priority to Chinese Patent Application No. 202010354537.3 filed in China on Apr. 29, 2020, the entire contents of which are incorporated herein by reference.

TECHNICAL FIELD

The present disclosure relates to the field of display technology, and more particularly to a display substrate, a method for manufacturing the display substrate, and a display device.

BACKGROUND

Due to different usage requirements, some components need to occupy space under a screen of a display panel. For example, an implementation of under-screen camera technology is to provide an opening region on the screen for camera arrangement. This arrangement results in a small portion of the region around the opening region (called an L zone) having a lower pixel density than a normal region (called an H zone).

However, a gate signal is provided through a same signal line (gate line) to some pixels in the H zone and some pixels in the L zone that are in the same row, while other signal lines are only electrically connected to the pixels in the H zone and provide the gate signals; in these two cases, there is a certain difference between the gate signals of the pixels, resulting in a difference in the charging times of pixels, which may adversely affect uniformity of image brightness and display quality.

SUMMARY

In a first aspect, the embodiments of the present disclosure provide a display substrate, including a base substrate, a driving circuit layer and a light-emitting unit, wherein the driving circuit layer and the light-emitting unit are located on the base substrate, the light-emitting unit includes a first electrode and a second electrode that are laminated on each other, and a light-emitting layer located between the first electrode and the second electrode; the display substrate includes a first display region, a second display region, and an opening region; the second display region is located between the first display region and the opening region; and a pixel density of the first display region is greater than a pixel density of the second display region; and the display substrate further includes a compensation capacitor configured for compensating a sub-pixel in the second display region, wherein the compensation capacitor includes a first plate and a second plate, the first plate is electrically connected to the gate electrode of the sub-pixel in the second display region, and the second plate is electrically connected to the first electrode.

Optionally, the driving circuit layer includes a source drain electrode layer, and one of the first plate and the second plate is provided in a same layer and made of a same material as the source drain electrode layer.

Optionally, the second plate is provided in the same layer and made of the same material as the source drain electrode layer; the drive circuit layer further includes a third insulating layer located at a side of the source drain electrode layer distal to the base substrate; the light-emitting unit is located at a side of the third insulating layer distal to the base substrate; and a via hole is provided in the third insulating layer, the second electrode, and the light-emitting unit, and the second plate is electrically connected to the first electrode through the via hole.

Optionally, the display substrate includes a gate layer, wherein at least one of the first and second plates is provided in a same layer and made of a same material as the gate layer.

Optionally, in a direction away from the base substrate, the gate layer of the driving circuit layer includes a first gate metal layer and a second gate metal layer, the first plate of the compensation capacitor is provided in a same layer and made of a same material as the first gate metal layer, and the second plate of the compensation capacitor is provided in a same layer and made of a same material as the second gate metal layer.

Optionally, the first plate is electrically connected to the first gate metal layer through a connecting line, and the connecting line is provided in a same layer and made of a same material as the first gate metal layer;

the driving circuit layer includes the first gate metal layer, the first insulating layer, the second gate metal layer, the second insulating layer, the source drain electrode layer, and the third insulating layer which are arranged in that order in the direction away from the base substrate; the light-emitting unit is located at a side of the third insulating layer distal to the base substrate; the display substrate is provided with a via hole penetrating through the second insulating layer, the source drain electrode layer, the third insulating layer, the second electrode, and the light-emitting layer; and the second electrode is electrically connected to the first electrode through the via hole.

Optionally, one of the plates of the compensation capacitor is provided in a same layer and made of a same material as the second electrode.

Optionally, a display substrate further includes a gate layer, wherein the driving circuit layer includes a source drain electrode layer, the first plate is provided in a same layer and made of a same material as the gate layer, and the second plate is provided in a same layer and made of a same material as the source drain electrode layer.

Optionally, the drive circuit layer further includes a third insulating layer located at a side of the source drain electrode layer distal to the base substrate; the light-emitting unit is located at a side of the third insulating layer distal to the base substrate; and a via hole is provided in the third insulating layer, the second electrode, and the light-emitting unit, and the second plate is electrically connected to the first electrode through the via hole.

Optionally, the display substrate further includes a gate layer, wherein the second plate is provided in a same layer and made of a same material as the gate layer.

Optionally, in a direction away from the base substrate, the gate layer of the driving circuit layer includes the first gate metal layer and the second gate metal layer, the first plate of the compensation capacitor is provided in a same layer and made of a same material as the first gate metal layer, and the second plate of the compensation capacitor is provided in a same layer and made of a same material as the second gate metal layer.

Optionally, the first plate is electrically connected to the first gate metal layer through a connecting line, and the connecting line is provided in a same layer and made of a same material as the first gate metal layer;

the driving circuit layer includes the first gate metal layer, the first insulating layer, the second gate metal layer, the second insulating layer, the source drain electrode layer, and the third insulating layer which are arranged in that order in the direction away from the base substrate; the light-emitting unit is located at a side of the third insulating layer distal to the base substrate; the display substrate is provided with a via hole penetrating through the second insulating layer, the source drain electrode layer, the third insulating layer, the second electrode, and the light-emitting layer; and the second electrode is electrically connected to the first electrode through the via hole.

In a second aspect, the embodiments of the present disclosure further provide the display device including the display substrate as described above.

In a third aspect, the embodiments of the present disclosure also provide a method for manufacturing the display substrate, including a step of forming the compensation capacitor, wherein the display substrate includes a base substrate, a driving circuit layer and a light-emitting unit, wherein the driving circuit layer and the light-emitting unit are located on the base substrate, the light-emitting unit comprises a first electrode, a second electrode, and a light-emitting layer located between the first electrode and the second electrode, the display substrate includes a first display region, a second display region, and an opening region, the second display region is located between the first display region and the opening region, a pixel density of the first display region is greater than a pixel density of the second display region, and the compensation capacitor is configured for compensating a sub-pixel in the second display region; and one of the plates of the compensation capacitor is electrically connected to the gate electrode of the sub-pixel in the second display region, and the other one of the plates is electrically connected to the first electrode.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

Technical solutions in the embodiments of the present invention will be more clearly and fully described below in combination with the accompanying drawings in the embodiments of the present invention. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Some embodiments of the present disclosure provide a display substrate.

Figure 1:
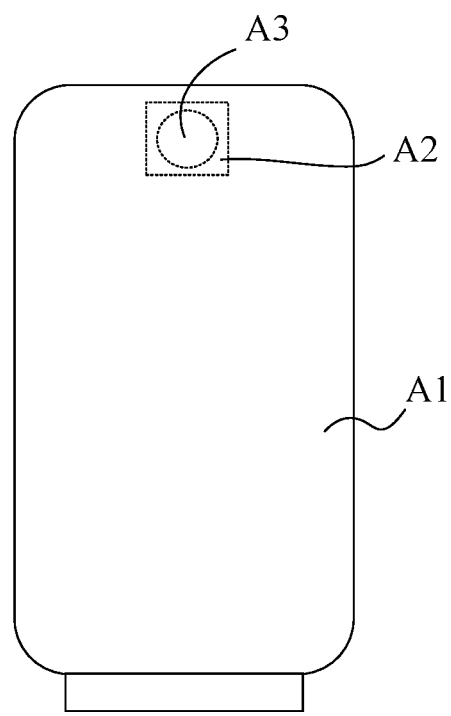
FIG. 1 is a schematic structural diagram of a display substrate according to some embodiments of the present disclosure.
Figure 2:
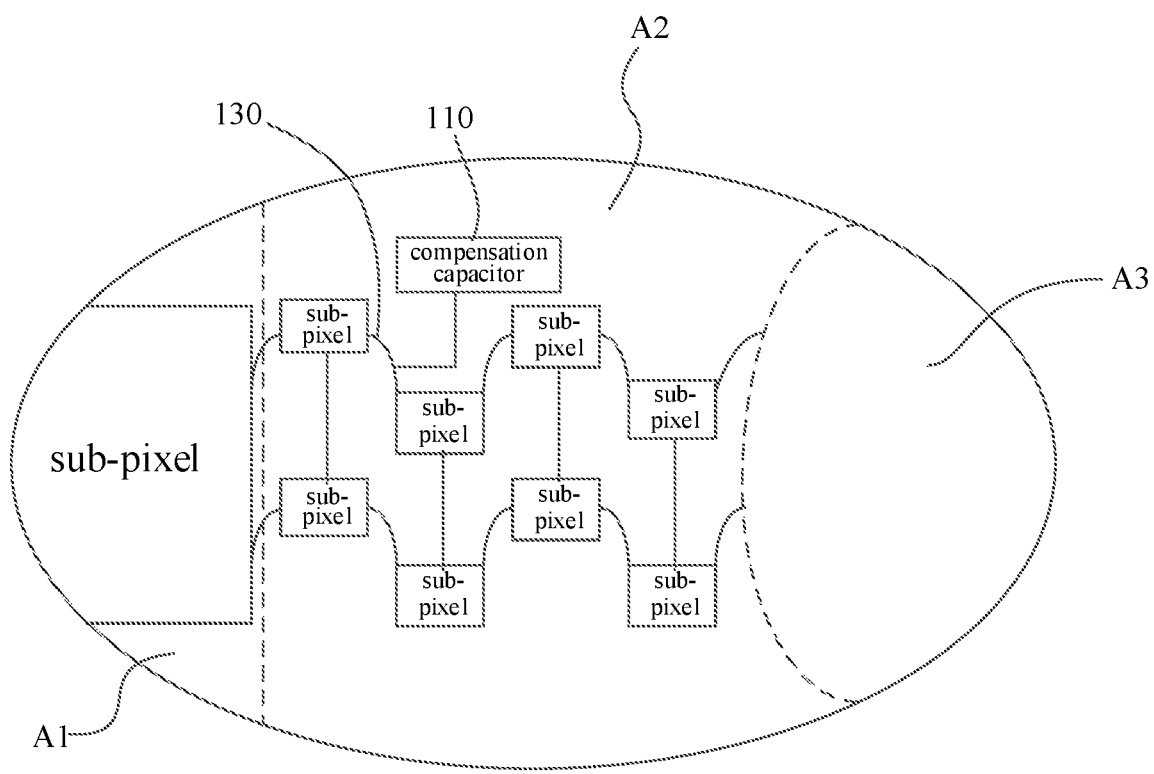
FIG. 2 is another schematic structural diagram of a display substrate according to some embodiments of the present disclosure.

As shown in FIG. 1, in some embodiments of the present disclosure, the display substrate includes a first display region A1, a second display region A2, and an opening region A3.

In the present embodiment, the first display region A1 refers to a regular display region in a display panel, wherein the first display region A1 has a generally high pixel density, which is also referred to as an H zone in the present embodiment.

An opening region A3 refers to a region where the sub-pixels are not arranged, but a component including, but not limited to, a camera is generally arranged.

The second display region A2 is typically located around the opening region A3, and it should be understood that in order to accommodate the presence of the opening region A3, some adaptation of the structure of the display substrate may be required, which results in the region in the neighboring region of the opening region A3 is affected to some extent, so that the pixel density of the second display region A2 is typically less than that of the first display region A1, the second display region in the present embodiment is also referred as the L zone.

As shown in FIG. 1, in some embodiments of the present disclosure, the opening region A3 is circular, and an outer contour of the second display region A2 is rectangular and arranged around the opening region A3.

It should be noted that, neither the shape nor the position of the second display region A2 and the opening region A3 is constant. For example, the opening region A3 may be moved to the edge of the active display region of the display substrate, such that the second display region A2 surrounds only a part of the opening region A3; for another example, the shapes of the second display region A2 and the opening region A3 may be adjusted. Specifically, the shape and position of the second display region A2 and the opening region A3 may be adjusted according to requirements, and are not further limited herein.

In the present embodiment, the display substrate includes the base substrate, the driving circuit layer located on the base substrate, and the light-emitting unit located on the base substrate; wherein the light-emitting unit includes a first electrode, a second electrode, and a light-emitting layer located between the first electrode and the second electrode laminated on each other. The specific structures of the driving circuit layer and the light emitting unit may be referred to the related art to some extent and are not further defined and described herein.

The display substrate further includes the compensation capacitor 110 configured for compensating the sub-pixels in the second display region A2, the compensation capacitor 110 includes the first plate and the second plate, wherein the first plate is electrically connected to the gate electrode 130 of the sub-pixels in the second display region A2, and the second plate is electrically connected to the first electrode, and the first electrode is the common electrode of the light-emitting unit so as to provide a stable signal source by using the first electrode.

In this way, the embodiments of the present disclosure provide the compensation capacitor 110 electrically connected to the gate electrode of the sub-pixels in the second display region A2, so as to compensate the gate signal line of the sub-pixels in the second display region A2, thereby achieving the adjustment of the charging time of the sub-pixels in the first display region A1 which are connected to the same gate signal line as the sub-pixels in the second display region A2, so as to improve the consistency of the charging times of the sub-pixels in the first display region A1, helping to improve the consistency of the image brightness, thereby improving the display effect.

In some embodiments of the present disclosure, the first plate and the second plate of the compensation capacitor 110 may be manufactured separately. For example, a respective conductive layer is deposited at each of different positions to form the first plate and the second plate of the compensation capacitor 110, and a conductive line is correspondingly manufactured to electrically connect the first plate with the gate electrode of the sub-pixel of the L zone, and the second plate is electrically connected with the first electrode.

In other embodiments of the present disclosure, the plates of the compensation capacitor 110 are manufactured simultaneously with the manufacturing of another film structure in the display substrate.

Specifically, the driving circuit layer includes the source drain electrode layer, and one of the first plate and the second plate is provided in the same layer and made of the same material as the source drain electrode layer.

For example, in the case that the second plate is provided in the same layer and made of the same material as the source drain electrode layer, when the source drain electrode layer is being manufactured, firstly the metal material layer is formed, and then the source drain electrode layer and the second plate are manufactured through one patterning process.

In this process, the source drain electrode layer and the plates of the compensation capacitor 110 can be manufactured simultaneously by adjusting the structure of the mask, without adding a process step, which contributes to cost saving.

It should be noted that, when the first plate is provided in the same layer and made of the same material as the source drain electrode layer, the manufacturing process for first plate is substantially the same as that for the second plate, and the main difference therebetween lies in adjusting the connection relationship and connection structure of electrical connection.

In some other embodiments of the present disclosure, the manufacturing of the plates of the compensation capacitor 110 can also be completed at the same time when manufacturing some other film structures. For example, the plates of the compensation capacitor 110 may also be provided in the same layer and made of the same material as a film structure, including but not limited to the gate layer of the driving circuit layer, the second electrode of the light-emitting unit, etc.

In other words, it is possible to form the plates of the compensation capacitor 110 by reserving a certain material through one patterning process when manufacturing other conductive film layers.

Furthermore, a via hole or a connecting line can also be provided according to needs so as to implement the electrical connection between the first plate and the gate electrode, and the electrical connection between the second plate and the first electrode.

In some embodiments of the present disclosure, the driving circuit layer of the display substrate includes the first gate metal layer, the first insulating layer (the second gate insulating layer), the second gate metal layer, the second insulating layer (an interlayer dielectric layer), the source drain electrode layer, and the third insulating layer (a planar layer) which are arranged in a direction away from the base substrate. The light-emitting unit is located on a side of the third insulating layer distal to the base substrate. The second electrode, the light-emitting layer, the fourth insulating layer (a pixel definition layer), and the first electrode of the light-emitting unit are laminated in that order in the direction away from the base substrate. Then, the via hole may extend through different film layers as needed to implement the electrical connection.

In some embodiments of the present disclosure, the first plate of the compensation capacitor 110 is provided in the same layer and made of the same material as the source drain electrode layer, and thus the via hole penetrating through the first insulating layer and the second insulating layer can be formed, and the via hole can also penetrate through the second gate metal layer or do not provided in the second gate metal layer according to needs, such that the first plate can be electrically connected to the first gate metal layer through the via hole.

In some other embodiments of the present disclosure, the second plate of the compensation capacitor 110 is provided in the same layer and made of the same material as the source drain electrode layer, and thus the via hole penetrating through the third insulating layer, the second electrode, and the light-emitting layer may be formed so as to implement the electrical connection between the source drain electrode layer and the first electrode through the via hole.

In some other embodiments of the present disclosure, the first plate of the compensation capacitor 110 is provided in the same layer and made of the same material as the first gate metal layer, and since the first plate is electrically connected to the first gate metal layer, the connecting line can be formed directly by reserving a part of material, in other words, the connecting line, the first gate metal layer, and the first plate are manufactured simultaneously by one patterning process.

In some other embodiments of the present disclosure, the second plate is provided in the same layer and made of the same material as the second gate metal layer, and thus the via hole penetrating through the second insulating layer, the source drain electrode layer, the third insulating layer, the second electrode, and the light-emitting layer needs to be formed, so as to implement the electrical connection between the second plate and the first electrode. It should be noted that, a conductive structure provided in the same layer and made of the same material as the source drain electrode layer can also be reserved, and the second plate is electrically connected to the conductive structure through the via hole, and furthermore, the conductive structure is electrically connected to the first electrode through the via hole.

It should be understood that the positions of the first plate and the second plate are not fixed. For example, the first plate may be located between the second plate and the base substrate, or the second plate may be located between the first plate and the base substrate, as long as the electrical connection is implemented by forming a corresponding via hole.

For example, the first plate and the second gate metal layer are provided in the same layer and made of the same material, and are electrically connected to the first gate metal layer through the via hole, and the second plate and the source drain electrode layer are provided in the same layer and made of the same material, and are electrically connected to the first electrode through the via hole; in another embodiment, the first plate and the source drain electrode layer are provided in the same layer and made of the same material, and are electrically connected to the first gate metal layer through the via hole, and the second plate and the second gate metal layer are provided in the same layer and made of the same material, and are electrically connected to the first electrode through the via hole.

In the following, the present disclosure will be further described with reference to the embodiments illustrated in FIGS. 3A and 3B.

Figure 3A:
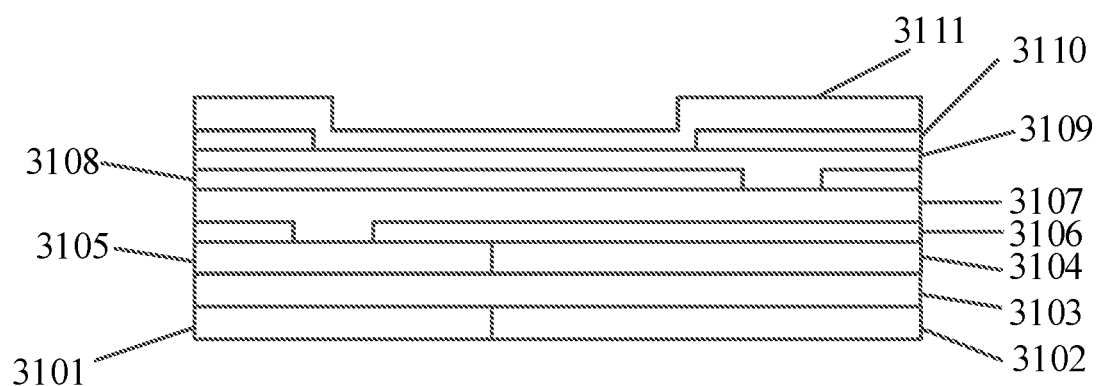
FIG. 3A is yet another schematic structural diagram of a display substrate according to some embodiments of the present disclosure.

As shown in FIG. 3A, in some embodiments of the present disclosure, a first plate 3101 and a first gate metal layer 3102 are provided in the same layer and made of the same material, and are electrically connected; the first gate metal layer 3102, a first insulating layer (or referred to as a second gate insulating layer) 3103, and a second gate metal layer 3104 are successively laminated in that order; a second plate 3105 and the second gate metal layer 3104 are provided in the same layer and made of the same material and are insulated from each other; and the first plate 3101 and the second plate 3105 constitute the compensation capacitor 110.

The second plate 3105 is electrically connected to a first reserving structure 3107 through the via hole penetrating through a second insulating layer 3106, wherein the first reserving structure 3107 is provided in the same layer and made of the same material as the source drain electrode layer, and remains as the conductive structure when the source drain electrode layer is manufactured. The first reserving structure 3107 is electrically connected to a second reserving structure 3109 through the via hole penetrating through a third insulating layer 3108, wherein the second reserving structure 3109 is provided in the same layer and made of the same material as the second electrode of the light-emitting unit, and remains as the conductive structure when the second electrode is manufactured, and the second reserving structure 3109 is electrically connected to a first electrode 3111 of the light-emitting unit through the via hole penetrating through a fourth insulating layer 3110.

Figure 3B:
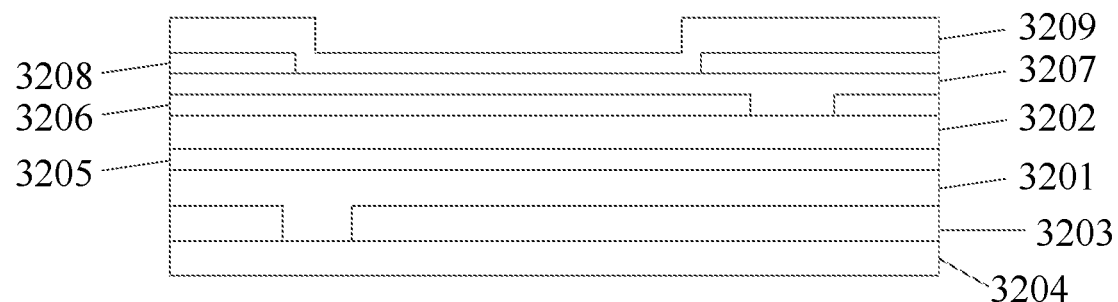
FIG. 3B is still yet another schematic structural diagram of a display substrate according to some embodiments of the present disclosure.

As shown in FIG. 3B, in some other embodiments of the present disclosure, a first plate 3201 and the second gate metal layer are provided in the same layer and made of the same material and are insulated from each other, and a second plate 3202 is provided in the same layer and made of the same material as the source drain electrode layer.

Furthermore, the first plate 3201 is electrically connected to a first gate metal layer 3204 through the via hole penetrating through a first insulating layer 3203; the first plate 3201 and the second plate 3202 are insulated by a second insulating layer 3205; the second plate 3202 is electrically connected to a third reserving structure 3207 through the via hole penetrating through a third insulating layer 3206; the third reserving structure 3207 is provided in the same layer and made of the same material as the second electrode of the light-emitting unit, and remains as the conductive structure when the second electrode is manufactured; and the third reserving structure 3207 is electrically connected to a first electrode 3209 of the light-emitting unit through the via hole penetrating through a fourth insulating layer 3208.

It should be noted that, the arrangement of the first and second plate and the arrangement of the via hole may be further adapted and are not further limited herein.

In some embodiments of the present disclosure, the compensation capacitor 110 is arranged in the second display region A2, i.e., the L zone described above. It should be understood that the pixel density of the H zone is relatively high, so that there is no more region for manufacturing the compensation capacitor 110, and the opening region A3 may be required for arranging a camera or the like, therefore, the light transmittance of the opening region A3 needs to be ensured. Thus, arranging the compensation capacitor 110 in the L zone helps to reduce possible adverse influence on the display effect.

Furthermore, in the present embodiment, electrical simulation is also performed on the pixel circuit provided with the above-mentioned compensation capacitor 110 and the pixel circuit not provided with the above-mentioned compensation capacitor 110, so as to verify the effect of the compensation capacitor on the pixels.

In a simulation process, full charge time (fall time) of a gate signal of a pixel row is compared with full charge time (fall time) of a gate signal of an adjacent pixel row. Generally, the larger the fall time, the less the charge time, and the higher the brightness.

Figure 4A:
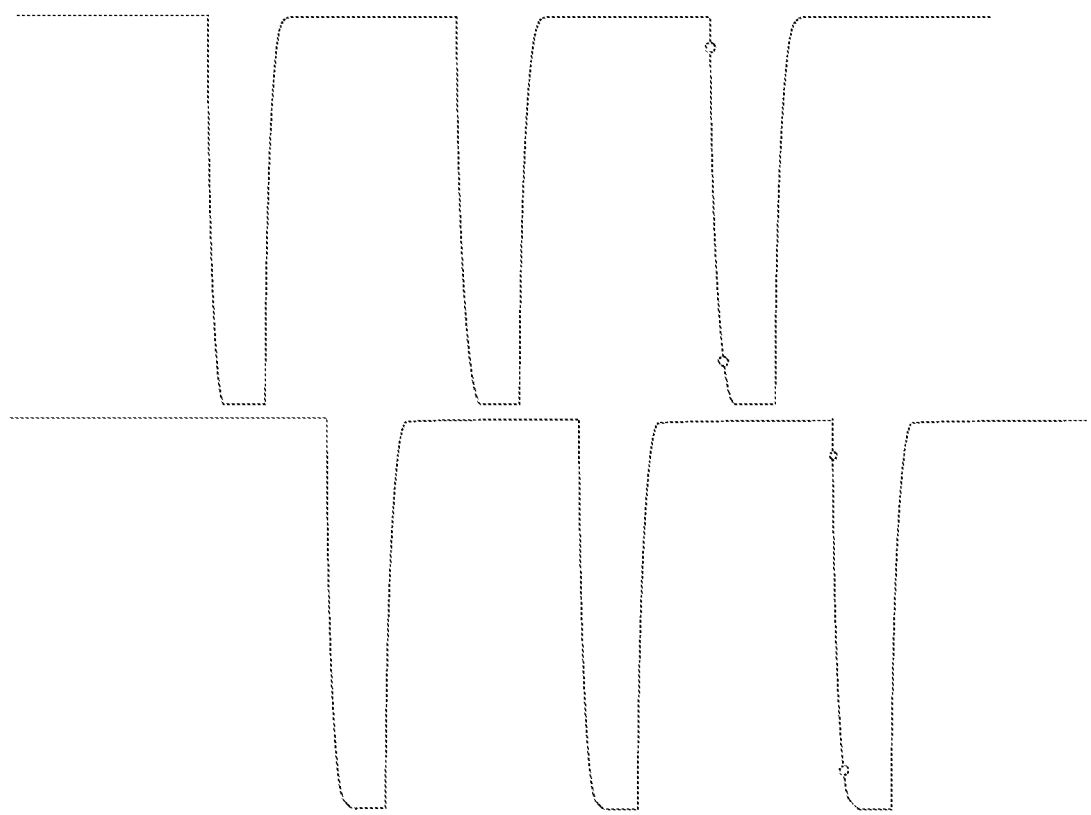
FIG. 4A illustrates a charging simulation result of sub-pixels of a display substrate in the related art.

Referring to FIG. 4A, the upper part in FIG. 4A is a simulation result of a first sub-pixel in the display substrate without the compensation capacitor, wherein the first sub-pixel is located in the H zone and located in the same row as the L zone; and the lower part in FIG. 4A is the simulation result of a second sub-pixel in the display substrate without the compensation capacitor, wherein the second sub-pixel is located in the H zone and located in the same column as the first sub-pixel.

In FIG. 4A, the horizontal axis represents the charging time, the vertical axis represents the charging rate, and a line between two circles represents the pixel charging process. It can be seen that before capacitance compensation, there is a considerable difference between the fall time of the gate signal of the first sub-pixel and the fall time of the gate signal of the second sub-pixel, which is about 15.7 ns (nanosecond).

Figure 4B:
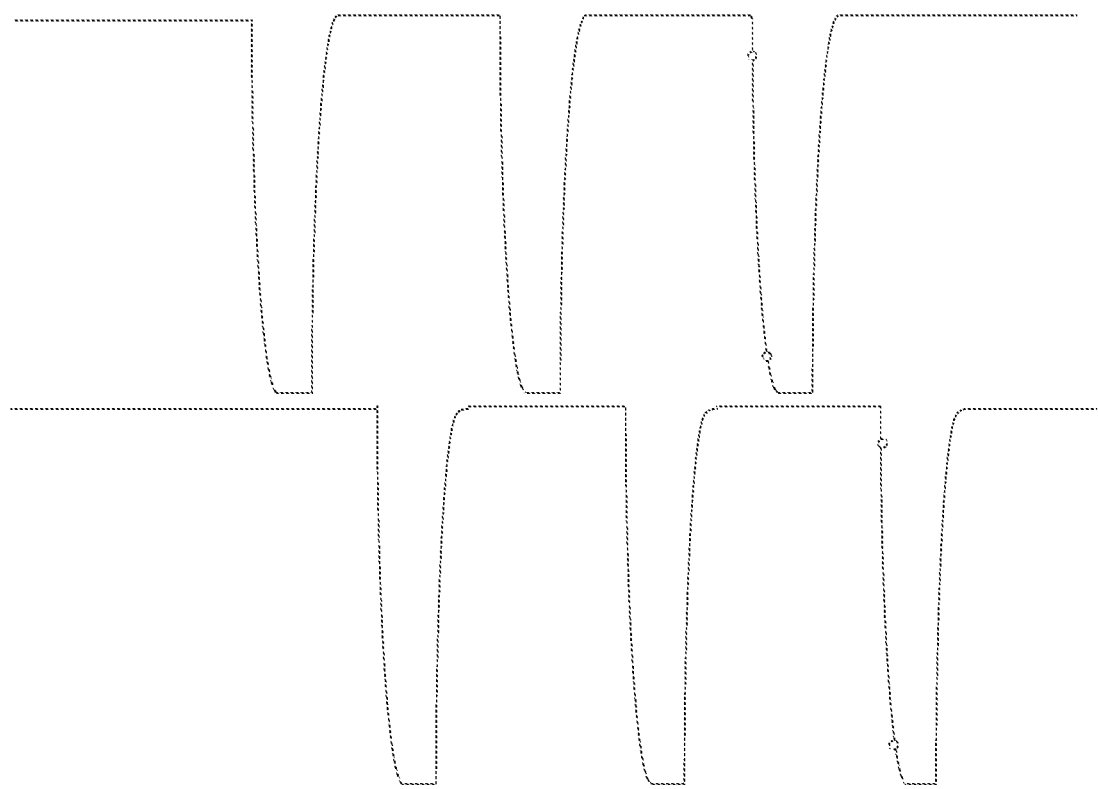
FIG. 4B illustrates a charging simulation result of sub-pixels of a display substrate in some embodiments of the present disclosure.

In FIG. 4B, the upper part represents the simulation result of the first sub-pixel in the display substrate provided with the compensation capacitor, and the lower part represents the simulation result of the second sub-pixel in the display substrate provided with the compensation capacitor, it can be seen that after the capacitance compensation is provided, the difference between the fall time of the gate signal of the first sub-pixel and the fall time of the gate signal of the second sub-pixel is significantly reduced, which is about 2 ns and indicates that such capacitance compensation is effective.

In other words, in this embodiment, the compensation capacitance is provided in the L zone, to enable to reduce the difference between the charge time of the sub-pixel of the H zone located in the same row as the L zone and the charging time of the sub-pixel of another H zone, thereby reducing the adverse influence on the uniformity of the display effect of the H zone.

The embodiments of the present disclosure also provide a display device including the display substrate as described.

According to the display device of the embodiment of the present invention, the gate signal line of the sub-pixel in the second display region is compensated by providing the compensation capacitor which is electrically connected to the gate electrode of the sub-pixel in the second display region, so as to adjust the charging time of the sub-pixel that is in the first display region and connected to the same gate signal line as the sub-pixel in the second display region, and thus the consistency of the charging times of the sub-pixels in the first display region is improved, which helps to improve the consistency of image brightness, thereby improving the display effect.

The display device may include, but is not limited to, a mobile phone, a tablet computer, a digital camera, a laptop portable computer, a vehicle-mounted computer, a desktop computer, a smart television, a wearable device, etc. Since the technical solutions of the present embodiment include all the technical solutions of the display substrate in the above embodiments, at least all the above-mentioned technical effects can be achieved by the display device, and the description thereof will not be repeated herein.

Embodiments of the present disclosure also provide the method for manufacturing the display substrate including a step of forming the compensation capacitor 110.

The plates of the compensation capacitor 110 may be manufactured separately at specific locations, or may be manufactured simultaneously with other film layers through the one patterning process as described above for the display substrate. For the structure of the compensation capacitor 110, it may refer to the above embodiments of the display substrate, and for the process thereof, it may refer to the related art, which will not be described in detail herein.

According to the method for manufacturing the display substrate provided by the embodiments of the present invention, the gate signal line of the sub-pixel in the second display region is compensated by providing the compensation capacitor which is electrically connected to the gate electrode of the sub-pixel in the second display region, so as to adjust the charging time of the sub-pixel that is in the first display region and connected to the same gate signal line as the sub-pixel in the second display region, and thus the consistency of the charging times of the sub-pixels in the first display region is improved, which helps to improve the consistency of image brightness, thereby improving the display effect.

The above are merely some embodiments of the present disclosure, but the scope of protection of the present disclosure is not limited thereto, and a person skilled in the art may made various modifications and substitutions without departing from the technical scope of the present disclosure, and these modifications and substitutions shall also fall within the scope of the present disclosure. Therefore, the scope of protection of the present disclosure shall be defined by the protection scope of claims.

What is claimed is:

1. A display substrate, comprising a base substrate, a driving circuit layer and a light-emitting unit, wherein the driving circuit layer and the light-emitting unit are located on the base substrate, the light-emitting unit comprises a first electrode and a second electrode that are laminated on each other, and a light-emitting layer located between the first electrode and the second electrode; the display substrate comprises a first display region, a second display region, and an opening region; the second display region is located between the first display region and the opening region; and a pixel density of the first display region is greater than a pixel density of the second display region; and the display substrate further comprises a compensation capacitor configured for compensating a sub-pixel in the second display region, wherein the compensation capacitor comprises a first plate and a second plate, the first plate is electrically connected to a gate electrode of the sub-pixel in the second display region, and the second plate is electrically connected to the first electrode;

the driving circuit layer comprises a gate layer;

wherein in a direction away from the base substrate, the gate layer of the driving circuit layer comprises a first gate metal layer and a second gate metal layer, one plate of the first plate and the second plate of the compensation capacitor is provided in a same layer and made of a same material as the first gate metal layer, and the other plate of the compensation capacitor is provided in a same layer and made of a same material as the second gate metal layer.

2. The display substrate according to claim 1, wherein the driving circuit layer further comprises a source drain electrode layer, and one of the first plate and the second plate is provided in a same layer and made of a same material as the source drain electrode layer.

3. The display substrate according to claim 2, wherein the second plate is provided in the same layer and made of the same material as the source drain electrode layer; the drive circuit layer further comprises a third insulating layer and a fourth insulating layer located at a side of the source drain electrode layer distal to the base substrate; the light-emitting unit is located at a side of the third insulating layer distal to the base substrate; and a via hole is provided in the third insulating layer and the fourth insulating layer, and the second plate is electrically connected to the first electrode through the via hole.

4. The display substrate according to claim 1, wherein the first plate is electrically connected to the first gate metal layer through a connecting line, and the connecting line is provided in a same layer and made of a same material as the first gate metal layer;

the driving circuit layer comprises the first gate metal layer, a first insulating layer, the second gate metal layer, a second insulating layer, the source drain electrode layer, and the third insulating layer which are arranged in that order in the direction away from the base substrate; the light-emitting unit is located at a side of the third insulating layer distal to the base substrate; the display substrate is provided with a via hole penetrating through the second insulating layer, the source drain electrode layer, the third insulating layer, the second electrode, and the light-emitting layer; and the second plate is electrically connected to the first electrode through the via hole.

5. The display substrate according to claim 1, wherein one of the plates of the compensation capacitor is provided in a same layer and made of a same material as the second electrode.

6. The display substrate according to claim 1, wherein the driving circuit layer further comprises a source drain electrode layer, and the second plate is provided in a same layer and made of a same material as the source drain electrode layer.

7. The display substrate according to claim 6, wherein the drive circuit layer further comprises a third insulating layer and a fourth insulating layer located at a side of the source drain electrode layer distal to the base substrate; the light-emitting unit is located at a side of the third insulating layer distal to the base substrate; and a via hole is provided in the third insulating layer and the fourth insulating layer, and the second plate is electrically connected to the first electrode through the via hole.

8. A display device, comprising the display substrate according to claim 1.

9. The display device according to claim 8, wherein the driving circuit layer further comprises a source drain electrode layer, and one of the first plate and the second plate is provided in a same layer and made of a same material as the source drain electrode layer.

10. The display device according to claim 9, wherein the second plate is provided in the same layer and made of the same material as the source drain electrode layer; the drive circuit layer further comprises a third insulating layer and a fourth insulating layer located at a side of the source drain electrode layer distal to the base substrate; the light-emitting unit is located at a side of the third insulating layer distal to the base substrate; and a via hole is provided in the third insulating layer and the fourth insulating layer, and the second plate is electrically connected to the first electrode through the via hole.

11. The display device according to claim 8, wherein the first plate is electrically connected to the first gate metal layer through a connecting line, and the connecting line is provided in a same layer and made of a same material as the first gate metal layer;

the driving circuit layer comprises the first gate metal layer, a first insulating layer, the second gate metal layer, a second insulating layer, the source drain electrode layer, and the third insulating layer which are arranged in that order in the direction away from the base substrate; the light-emitting unit is located at a side of the third insulating layer distal to the base substrate; the display substrate is provided with a via hole penetrating through the second insulating layer, the source drain electrode layer, the third insulating layer, the second electrode, and the light-emitting layer; and the second plate is electrically connected to the first electrode through the via hole.

12. The display device according to claim 8, wherein one of the plates of the compensation capacitor is provided in a same layer and made of a same material as the second electrode.

13. A method for manufacturing the display substrate, comprising a step of forming a compensation capacitor;

wherein the display substrate comprises a base substrate, a driving circuit layer and a light-emitting unit, wherein the driving circuit layer and the light-emitting unit are located on the base substrate, the light-emitting unit comprises a first electrode, a second electrode, and a light-emitting layer located between the first electrode and the second electrode, the display substrate comprises a first display region, a second display region, and an opening region, the second display region is located between the first display region and the opening region, a pixel density of the first display region is greater than a pixel density of the second display region, and the compensation capacitor is configured for compensating a sub-pixel in the second display region; and one of the plates of the compensation capacitor is electrically connected to the gate electrode of the sub-pixel in the second display region, and the other one of the plates is electrically connected to the first electrode;

the driving circuit layer comprises a gate layer;

wherein in a direction away from the base substrate, the gate layer of the driving circuit layer comprises a first gate metal layer and a second gate metal layer, one plate of the first plate and the second plate of the compensation capacitor is provided in a same layer and made of a same material as the first gate metal layer, and the other plate of the compensation capacitor is provided in a same layer and made of a same material as the second gate metal layer.

* * * * *